(12) United States Patent
Park (10) Patent No.: US 10,416,208 B2
(45) Date of Patent: Sep. 17, 2019

(54) METHOD AND APPARATUS FOR DETECTING ELECTRONIC DEVICE CONNECTED TO SMART PLUG

(71) Applicant: Samsung Electronics Co., Ltd., Suwon-si, Gyeonggi-do (KR)

(72) Inventor: Youngjin Park, Bucheon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 597 days.

(21) Appl. No.: 15/033,800

(22) PCT Filed: Nov. 4, 2014

(86) PCT No.: PCT/KR2014/010529
§ 371 (c)(1),
(2) Date: May 2, 2016

(87) PCT Pub. No.: WO2015/069007
PCT Pub. Date: May 14, 2015

(65) Prior Publication Data
US 2016/0266183 A1   Sep. 15, 2016

(30) Foreign Application Priority Data

Nov. 7, 2013 (KR) ............ 10-2013-0134537
Dec. 3, 2013 (KR) ............ 10-2013-0149052

(51) Int. Cl.
*G01R 21/133*   (2006.01)
*G01R 21/00*    (2006.01)
*G06Q 50/06*    (2012.01)

(52) U.S. Cl.
CPC ....... *G01R 21/1331* (2013.01); *G01R 21/001* (2013.01); *G01R 21/133* (2013.01); *G06Q 50/06* (2013.01)

(58) Field of Classification Search
CPC ................................................. G01R 21/1331
See application file for complete search history.

(56) References Cited

U.S. PATENT DOCUMENTS 6,906,617 B1    6/2005  Van der Meulen
2010/0109619 A1 5/2010  Tsou et al.
(Continued)

FOREIGN PATENT DOCUMENTS

CN    1416629 A     5/2003
CN    102142062 A   8/2011
(Continued)

*Primary Examiner* — Marc Anthony Armand
(74) *Attorney, Agent, or Firm* — Jefferson IP Law, LLP (57) ABSTRACT

The present invention relates to a method and an apparatus for detecting, from a smart plug, an electronic device connected to the smart plug, and more specifically, to a method and an apparatus for detecting a change in an electronic device connected to a smart plug. A method, according to one embodiment of the present invention, is the method for detecting a connected electronic device from the smart plug and comprises the steps of: inspecting whether pre-trained data is present when the an electronic device is connected; inspecting whether the connected electronic device and the pre-trained data match when the pre-trained data is present; a training step of obtaining information on valid power, invalid power, and power factor when the connected electronic device and the pre-trained data do not match; and saving trained data after the training is complete.

20 Claims, 5 Drawing Sheets

(56) References Cited

U.S. PATENT DOCUMENTS

| | | |
|---|---|---|
| 2010/0211509 A1 | 8/2010 | Jacobs |
| 2011/0004421 A1 | 1/2011 | Rosewell et al. |
| 2011/0190953 A1 | 8/2011 | Park et al. |
| 2011/0304205 A1 | 12/2011 | Lee |
| 2013/0132008 A1* | 5/2013 | Borean .................. G01D 4/00 702/60 |
| 2013/0179124 A1* | 7/2013 | Patel .................. G01R 31/2825 702/190 |
| 2013/0274943 A1 | 10/2013 | Nojima et al. |
| 2014/0248802 A1 | 9/2014 | Hieda et al. |
| 2016/0043554 A1 | 2/2016 | Kubota et al. |

FOREIGN PATENT DOCUMENTS

| | | |
|---|---|---|
| CN | 102379075 A | 3/2012 |
| JP | 2006-135685 A | 5/2006 |
| JP | 2008-306840 A | 12/2008 |
| KR | 10-2011-0057865 A | 6/2011 |
| KR | 10-2013-0073788 A | 7/2013 |
| WO | 02/41585 A2 | 5/2002 |
| WO | 2013/022035 A1 | 2/2013 |

\* cited by examiner

METHOD AND APPARATUS FOR DETECTING ELECTRONIC DEVICE CONNECTED TO SMART PLUG

TECHNICAL FIELD

The present invention relates to a method and apparatus for detecting in a smart plug an electronic device connected to the smart plug and, more particularly, to a method and apparatus for detecting a change of an electronic device connected to a smart plug.

BACKGROUND ART

All electronic devices use electricity as an energy source. A method of providing electricity to be used in electronic devices may include a method of directly providing electricity to an electronic device by connecting a plug to a socket at which a power line is connected and a method of providing electricity to an electronic device using a battery that generates electricity using a chemical operation. Such electronic devices are widely used in various forms and fields, for example appliances used in a home may be driven when electricity is supplied and most devices used in a factory or an office may be driven when electricity is supplied.

In this way, electric energy may have much influence on our life, and it functions as an essential energy source. Nowadays, in most countries, research is being conducted to find cheaper and safer methods for producing electric energy, which is an important energy source.

With the development of information and communication technology, information and communication technology is being used generally in electronic devices used in homes. Smart electronic devices that can provide functions in addition to the basic function provided by the corresponding electronic device as well as technology for communication with electronic devices generally used in a home have gradually been launched. Smart electronic devices used in a home are generally referred to as smart home appliances.

Many smart home appliances have a power measuring function for measuring their own power consumption and may share information thereof with other devices using a wired or wireless external interface. However, it is expected to take a long time until smart home appliances are widespread in the home appliance market. In particular, the spread of smart home appliances has been slow because it costs much to replace general home appliances with smart home appliances.

As an alternative to the replacement of general home appliances by smart home appliances, a smart plug has been developed. Whenever an electronic device operates, the smart plug has a function of measuring consumption power and transmitting the measured consumption power to another device, for example, a computer (PC) or a home energy manager (HEM). When such a smart plug is used, a smart home may be established even with the existing general home appliances. That is, when a smart plug is used, a quantity of electricity consumed for an idle time of an electronic device connected to the smart plug or a quantity of electricity consumed while operating an electronic device connected to the smart plug may be detected, and information about the detected quantity may be provided to a user.

Therefore, by managing an energy use situation or history of each electronic device, a user may receive a guide for energy saving.

DISCLOSURE OF INVENTION

Technical Problem

However, a previously developed initial smart plug simply measures only consumption power. Therefore, it is difficult to know an electronic device operating by interlocking with a corresponding smart plug; and, for this reason, a process in which a user or related technicians individually register electronic devices operating by interlocking with a corresponding smart plug is required.

Further, an electronic device registered to interlock with a smart plug may be changed for several reasons, for example, movement or new disposition of furniture within a home. When a connection of the electronic device interlocked with the smart plug is changed, a process of newly reflecting change information of the electronic devices to each smart plug is required.

The present invention has been made in view of the above problems, and provides a smart plug apparatus and a method for detecting a change of an electronic device connected to a smart plug.

The present invention further provides a smart plug apparatus and a method for quickly detecting a change of an electronic device connected to a smart plug.

The present invention further provides a smart plug apparatus and a method for quickly detecting a change of an electronic device connected to a smart plug and minimizing user intervention.

The present invention further provides a smart plug apparatus and a method for improving reliability of consumption power of each electronic device connected to a smart plug.

The present invention further provides a method and apparatus for quickly detecting a change of an interlocked electronic device, when a combination of electronic devices interlocked with a smart plug is changed.

The present invention further provides a method and apparatus for reliably providing information about consumption power of each electronic device to a user by quickly detecting and adjusting a changed combination, even if a combination of electronic devices interlocked with a smart plug is changed.

Solution to Problem

In accordance with an aspect of the present invention, a method of detecting an electronic device connected to a smart plug includes determining whether already trained data exist, when the electronic device is connected; determining, if already trained data exist, whether the connected electronic device corresponds to the already trained data; performing training during which information of active power, reactive power, and a power factor of the connected electronic device is acquired, if the connected electronic device does not correspond to the already trained data; and storing trained data, when the training is complete.

In accordance with another aspect of the present invention, an apparatus for detecting an electronic device connected to a smart plug includes a plug connection portion that determines whether the electronic device is connected and that provides a path that supplies power, when the electronic device is connected; a socket connection portion connected to a socket that supplies electricity to supply power to the plug connection portion; a power measurement unit that measures power supplied from the socket connection portion to the plug connection portion; a memory that stores trained information of active power, reactive power, and a power factor; a communication unit that communicates with another smart plug or a Home Energy Manager (HEM); and a controller that determines whether already trained data exist at the memory, when detecting from the plug connection portion that the electronic device is connected, that determines whether the connected electronic device corresponds to the already trained data, if the already trained data exist, and that controls to perform training during which information of active power, reactive power, and a power factor of the connected electronic device is acquired and to store trained data at the memory, if the connected electronic device does not correspond to the already trained data.

Advantageous Effects of Invention

When using a smart plug according to the present invention, if a combination of electronic devices interlocked with the smart plug is changed, a change of the electronic device can be automatically detected and the smart plug can be automatically quickly adjusted to correspond to a detected change. Further, when using a smart plug according to the present invention, even if a combination of interlocked electronic devices is changed, consumption power of each electronic device can be reliably provided to a user, and the smart plug can be compensated to prevent an error from occurring in statistical data of consumption power of the electronic device. Thereby, user convenience can be improved.

MODE FOR THE INVENTION

Hereinafter, various exemplary embodiments of the present invention will be described in detail with reference to the accompanying drawings. The same reference numbers are used throughout the drawings to refer to the same or like parts. Further, the attached drawings hereinafter are provided to help understanding of the present invention, and the present invention is not limited to a form or disposition illustrated in the drawings. Further, detailed descriptions of well-known functions and structures incorporated herein may be omitted to avoid obscuring the subject matter of the present invention. In the following description, only a portion necessary for understanding operation according to various exemplary embodiments of the present invention may be described, and a description of other portions may be omitted to avoid obscuring the subject matter of the present invention.

Figure 1A:
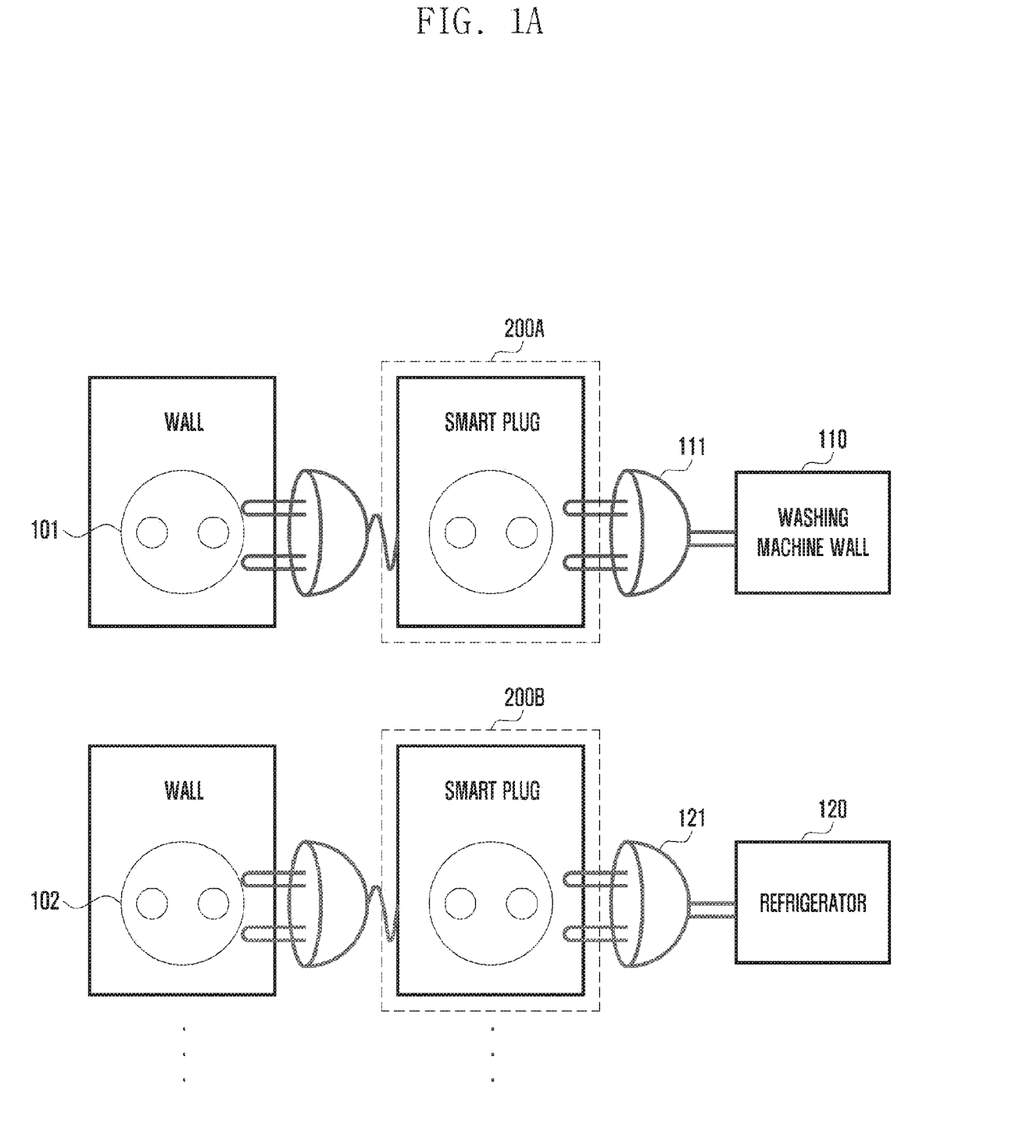
FIGS. 1A and 1B are diagrams illustrating a change of an electronic device interlocked with a smart plug when using the smart plug according to an exemplary embodiment of the present invention.
Figure 1B:
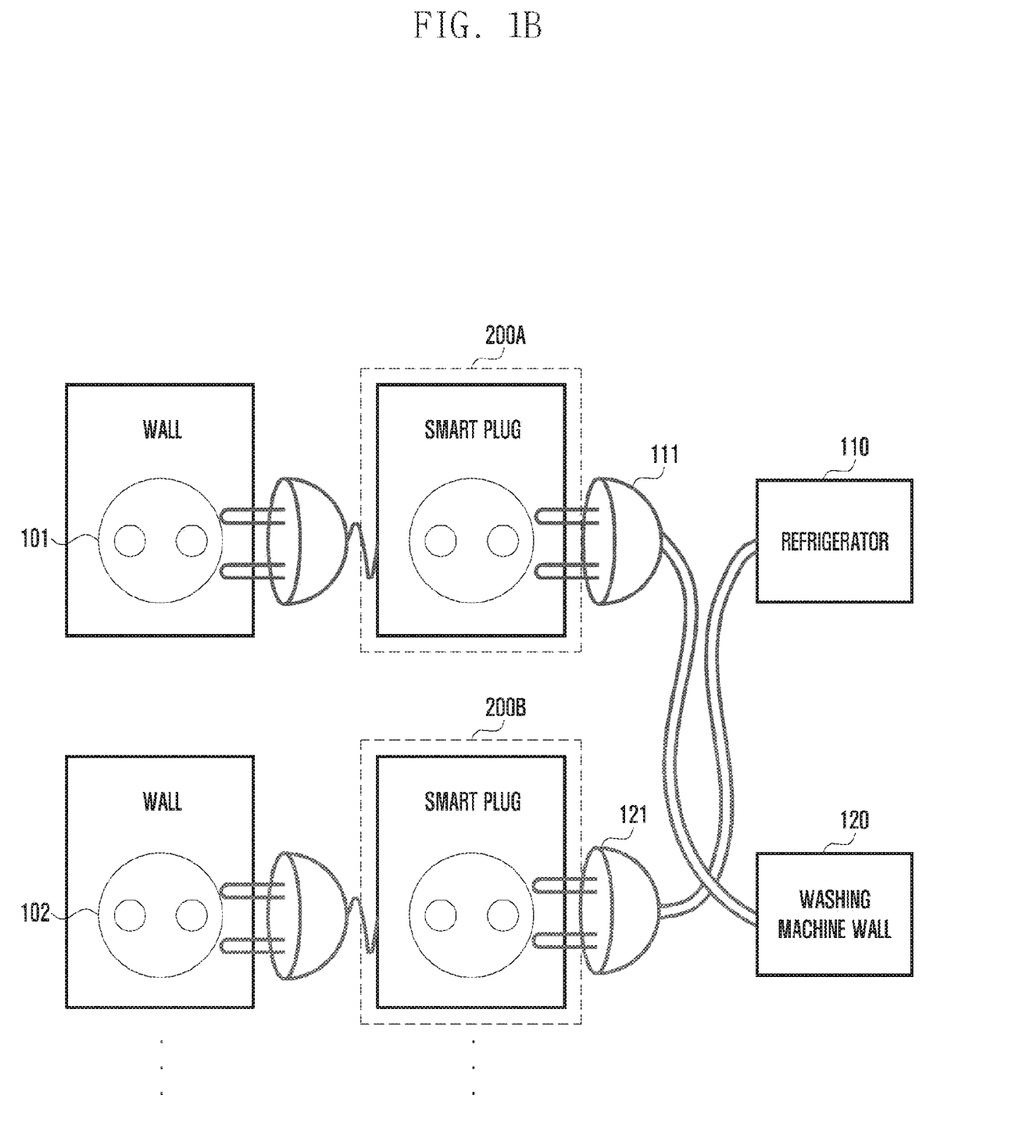

FIGS. 1A and 1B are diagrams illustrating a change of an electronic device interlocked with a smart plug when using the smart plug according to an exemplary embodiment of the present invention.

FIG. 1A illustrates a form in which two different sockets 101 and 102 are located at a wall. The two different sockets 101 and 102 are general sockets installed to supply electricity to electronic devices in a home.

Further, FIG. 1A illustrates two different smart plugs 200A and 200B connected to the respective sockets 101 and 102. The two different smart plugs 200A and 200B may have the same configuration. The respective smart plugs 200A and 200B may calculate a power amount, for example, active power, reactive power, and a power factor connected and consumed between different loads and a socket and may store calculated data. Therefore, the respective smart plugs 200A and 200B may compare information of calculated active power, reactive power, and power factor and previously stored active power, reactive power, and power factor, thereby distinguishing a kind of a connected load. Further, the respective smart plugs 200A and 200B may communicate with a home energy manager or/and another smart plug by a predetermined method, thereby sharing stored data or transmitting an initialization (reset) signal to another smart plug. A configuration and operation of the smart plugs 200A and 200B operating in this way will be described in detail with reference to the drawings.

In FIG. 1A, as an example of a load being used at a home, a washing machine 110 and a refrigerator 120 are illustrated. The washing machine 110 and refrigerator 120 being used at a home have plugs 111 and 121 respectively for receiving power. The washing machine 110 and the refrigerator 120, which are electronic devices being used in a home, may be connected by plugs 111 and 121 respectively for receiving power from the respective smart plugs 200A and 200B. Further, the smart plugs 200A and 200B may be connected to the sockets 101 and 102, respectively, located at the wall. Therefore, the washing machine 110 and the refrigerator 120 may be resultantly driven using electricity supplied from the respective sockets 101 and 102 located at the wall.

In such a case, a change of a connection of the smart plugs 200A and 200B, the washing machine 110, and the refrigerator 120 is described with reference to FIG. 1B.

Compared with FIG. 1A, in a configuration of FIG. 1B, the plug 121 provided with the refrigerator 110, which is an electronic device, is connected to the second smart plug 200B, and the plug 111 provided with the washing machine 120 is connected to the first smart plug 200A. An example in which a connection of the smart plugs 200A and 200B and electronic devices is changed as described above may be various cases such as movement, cleaning, and disposition change of furniture. However, when this process is not smoothly performed, an error occurs in provision of power consumption information of the washing machine and the refrigerator that may cause confusion to a user.

When a configuration as illustrated in FIG. 1A is changed to a configuration as illustrated in FIG. 1B, the user should recognize the change and newly register a change of the smart plug. That is, whenever a combination of the smart plug and an interlocking device is changed, the user should manually perform a change registration process. This may cause inconvenience to the user.

In order to prevent this, the present invention may detect a change of the electronic device connected to the smart plugs 200A and 200B. For example, when a configuration as illustrated in FIG. 1A is changed to a configuration as illustrated in FIG. 1B, the smart plugs 200A and 200B according to an exemplary embodiment of the present invention may detect the change and recognize a connected electronic device and notify the user or/and the home energy manager of any recognized information. Further, when the connected electronic device is changed and when training is complete, the smart plugs 200A and 200B according to an exemplary embodiment of the present invention may notify other smart plugs of a change of the connected electronic device and transmit together training data to the other smart plugs.

Figure 2:
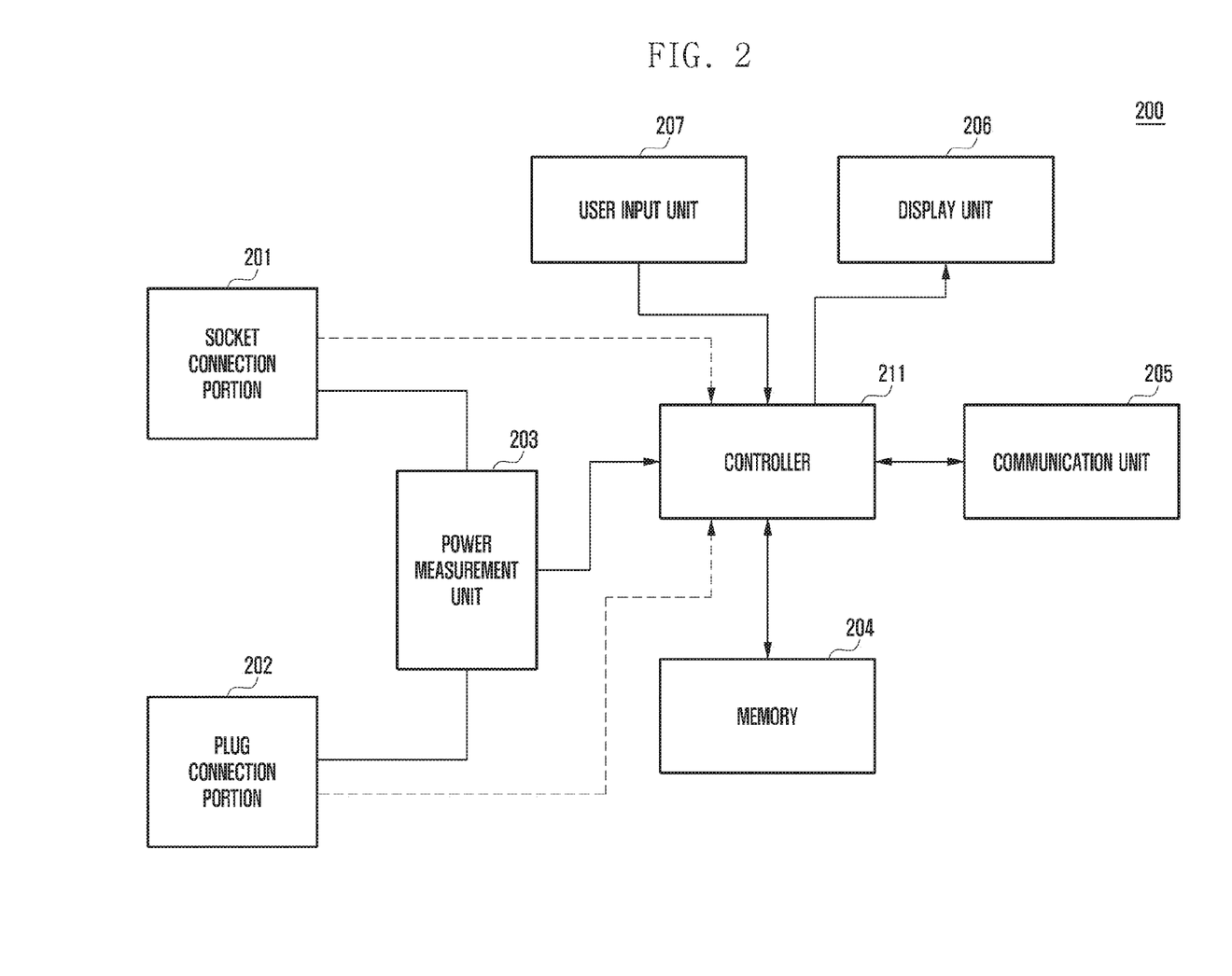
FIG. 2 is a block diagram illustrating a configuration for detecting a change of an electronic device interlocked with a smart plug and changing setting thereof according to an exemplary embodiment of the present invention.

FIG. 2 is a block diagram illustrating a configuration for detecting a change of an electronic device interlocked with a smart plug and changing setting thereof according to an exemplary embodiment of the present invention. Hereinafter, a configuration of the smart plug according to an exemplary embodiment of the present invention will be described with reference to FIG. 2. Further, when describing FIG. 2, reference numeral 200 is given to the smart plugs 200A and 200B of FIGS. 1A and 1B.

Referring to FIG. 2, the smart plug includes a socket connection portion 201 and a plug connection portion 202. As shown in FIGS. 1A and 1B, the socket connection portion 201 may include a mechanical plug connected to any one of the sockets 101 and 102 attached to the wall. Further, the socket connection portion 201 may have a structure that can determine whether the smart plug is connected to the plug attached to the wall. For example, when the socket connection portion 201 is connected to the socket to which power is applied, the socket connection portion 201 may determine whether the socket connection portion 201 is plugged to the socket through a circuit (not shown in FIG. 2) that can detect injection of a current. Detection information on whether the socket connection portion 201 is in a connected state to the socket may be directly provided to a controller 211 or may be provided to the power measurement unit 203.

The plug connection portion 202 may include a mechanical configuration of a socket form for connecting to a plug provided in an electronic device, for example, the refrigerator 110 and the washing machine 120. Further, the plug connection portion 202 may supply electricity provided from the socket connection portion 201 to the electronic device connected to the plug connection portion 202. Such a plug connection portion 202 may have a mechanical structure that can determine whether the plug provided in the electronic device is connected. A form having a mechanical structure that can determine whether the plug connection portion 202 is connected to the plug may be various forms. Hereinafter, two forms are described.

First, when the plug of the electronic device is inserted into the plug connection portion 202 of the smart plug 200, the plug connection portion 202 may include a detection device of a button type presser foot. For example, when the plug of the electronic device is inserted into the plug connection portion 202, the presser foot may be automatically pressed, generate a signal on whether the presser foot is pressed, and determine whether the plug of the electronic device is connected to the plug connection portion 202. Further, a signal generated by pressing of the presser foot may be provided to a power measurement unit 203 or the controller 211.

Second, when the plug of the electronic device is inserted into the plug connection portion 202 of the smart plug 200, an electrical path is formed between an internal circuit of the smart plug and the electronic device; thus, the plug connection portion 202 may be formed in a form of detecting whether the plug of the electronic device is inserted or separated.

A form for determining whether the plug of the electronic device is inserted into the plug connection portion 202 may exist with various methods such as a method of using an electromagnetic sensor or a method of detecting and determining flow of a current in addition to a form illustrated in the foregoing description. Detection information on whether the plug connection portion 202 is in a connected state to the plug provided in the electronic device may be directly provided to the controller 211 or may be provided to the controller 211 through the power measurement unit 203.

The power measurement unit 203 may measure power supplied from the socket connection portion 201 to the plug connection portion 202. The power measurement unit 203 may be connected in series or in parallel between the socket connection portion 201 and the plug connection portion 202 and may have a serial/parallel mixing structure, as necessary.

Further, the power measurement unit 203 may convert power information supplied to the plug connection portion 202, for example, consumption power information measured to calculate active power, reactive power, and a power factor to a digital value and may provide the digital value to the controller 211. For example, in order to generate active power and reactive power consumed in the electronic device, the power measurement unit 203 may measure a current, a voltage, and a phase difference of the current and the voltage, convert the value to a digital value, and provide the digital value to the controller 211. Further, in order to calculate a power factor, the power measurement unit 203 may provide apparent power. Apparent power may be represented with the product of an effective value of a current and an effective value of a voltage, the effective value of a current and the effective value of a voltage may be provided to the controller 211, and the power measurement unit 203 may calculate apparent power and provide the calculated apparent power to the controller 211. In the following description, it is assumed that the power measurement unit 203 provides only an effective value of a voltage and an effective value of a current.

Further, the power measurement unit 203 may receive information about whether a socket or/and a plug is in a state inserted into the socket connection portion 201 or/and the plug connection portion 202. When receiving information about whether a socket or/and a plug is in a state inserted into the socket connection portion 201 or/and the plug connection portion 202, the power measurement unit 203 may convert the information to a digital signal and provide the digital signal to the controller 211.

The controller 211 may calculate active power, reactive power, and a power factor on each mode basis of electronic devices using information on power supplied to the electronic device connected to the smart plug 200 through the smart plug 200 and power information input to the smart plug 200. Further, the controller 211 may control to store active power, reactive power, and a power factor calculated on each mode basis at a memory 204. Further, the controller 211 may determine whether an electronic device connected to the smart plug is changed using already trained data and currently calculated active power, reactive power, and power factor.

The controller 211 may control to provide an energy use amount of an electronic device connected to the smart plug to the home energy manager based on identification information of electronic devices connected to the smart plug. Further, when receiving reset information from another smart plug or home energy manager, change information of an electronic device connected to a specific smart plug, or information of active power, reactive power, and a power factor of a new electronic device connected to a specific smart plug, the controller 211 may control to update or delete corresponding information at the memory 204.

Thereby, when the electronic device connected to a smart plug is changed, the controller 211 may notify a user or a home energy manager of information about an electronic device whose connection is changed using stored data that was acquired from another smart plug, for example, information of active power, reactive power, and a power factor of an electronic device connected to another smart plug and a name of an electronic device connected to a corresponding smart plug.

A stored form of trained data on each electronic device basis by the controller 211 is illustrated in Table 1.

TABLE 1

| Electronic device | Cycle | Active power [W] | Reactive power [W] | Power factor |
|---|---|---|---|---|
| Refrigerator | Status 1 (cooling) | 178 | 83 | 0.72 |
| | Status 2 (defrosting) | 310 | 20 | 0.95 |
| | . | . | . | . |
| | . | . | . | . |
| | . | . | . | . |
| Washing machine | Status 1 (washing) | 480 | 350 | 0.8 |
| | Status 2 (rinse) | 450 | 300 | 0.8 |
| | Status 3 (dehydration) | 350 | 240 | 0.8 |
| | . | . | . | . |
| | . | . | . | . |
| | . | . | . | . |
| Dryer | Status 1 | 1800 | 180 | 0.98 |
| | Status 2 | 160 | 150 | 0.68 |
| | . | . | . | . |
| | . | . | . | . |
| | . | . | . | . |
| . | . | . | . | . |
| . | . | . | . | . |
| . | . | . | . | . |

As illustrated in Table 1, the electronic device may have various states; and active power, reactive power, and a power factor used in each state of the various states may be calculated and included. In Table 1, a refrigerator may have a cooling state, which is Status 1, and a defrosting state, which is Status 2; and it may have the same or different information of active power, reactive power, and a power factor.

A washing machine as illustrated in Table 1 may have a washing state, which is Status 1; a rinse state, which is Status 2; and a dehydration state, which is Status 3; and a dryer may have Status 1 and Status 2.

A data table of Table 1 is generated for a training period, and when training is complete, the data table may be stored at the memory 204 by the controller 211. Further, information about another electronic device may be shared by another smart plug with a predetermined communication method and may be stored at the memory 204 of each smart plug. Thereby, the smart plugs may share information of an electronic device connected to another smart plug as well as an electronic device connected to a corresponding smart plug.

Further, in order to generate a data table of Table 1, until training is complete, a combination of electronic devices interlocked with the smart plug should not be changed. While training, when a combination of electronic devices is changed, training should be restarted from the beginning. Further, a completion reference of training is when a name of an electronic device is determined with collected information. The name of an electronic device may be determined by a user and may be acquired from a home energy manager. As another method, when an electronic device connected to a smart plug is changed, the smart plug may compare changed data with existing data, recommend a specific name to the user or the home energy manager, and receive a determination signal of a corresponding name.

Operation of detecting a change of an electronic device connected to a smart plug and recommending a specific name of another electronic device will be described. In order to detect a change of an electronic device connected to a smart plug and to recommend a name thereof, training for one cycle of power use is required. For example, one cycle of power use of a washing machine is described.

When the washing machine is driven, a series of processes of water supply→washing→rinse→drainage→dehydration is performed. Therefore, an entire operation from water supply to dehydration may be one cycle; active power, reactive power, and a power factor may be calculated on an each step basis; it may be determined whether matched information exists in a previously provided table; and a specific name may be recommended. Further, a name of an electronic device may be recommended through only one step instead of an entire cycle. For example, when it is detected that an electronic device that is different from an already connected electronic device is connected to the smart plug and when data for active power, reactive power, and a power factor of water supply of a form similar to a previously stored table does not exist, a specific name may be recommended from only one step.

As another example, in a refrigerator, a series of processes of defrosting→cooling→standby may be repeatedly performed. In a series of processes, at a time point at which the same process is again repeated, it may be detected that a new cycle is started; thereby, one cycle may be determined.

As described above, electronic devices may have different power values used in each state according to an operating form, and the controller 211 may determine a connected electronic device based on different power values. Further, the controller 211 may receive an energy data log of an electronic device to which a corresponding smart plug is connected from another smart plug. Therefore, when an energy data log of an electronic device to which each smart plug is connected is received from a plurality of smart plugs, all data having a form of Table 1 may be stored at the memory 204. A detailed operation to be performed at the controller 211 will be described in detail with reference to a control flowchart to be described later.

The memory 204 may have an area for storing control data necessary for operation of the smart plug and data generated when operating the smart plug, and table information described above, for example information of Table 1, may be stored by the control of the controller 211.

A communication unit 205 may transmit/receive data between the smart plug and the home energy manager or data between other smart plugs with a wired/wireless method by the control of the controller 211. When the smart plugs are connected by wire, it may be difficult to maintain a communication line; thus, it is preferable that the communication unit 205 uses a wireless method.

A display unit 206 may have an alarm unit, using sound or audio, or/and a form of a red or blue Light Emitting Diode (LED). Further, when a price condition is satisfied, by adding a panel of a Liquid Crystal Display (LCD), Light Emitting Diode (LED), or Organic Light Emitting Diode (OLED), the display unit 206 may display a name, power efficiency, and power amount usage of an electronic device connected to the smart plug and a change of an electronic device connected to the smart plug.

A user input unit 207 may be formed with keys for a user key input, when a user wants to reset or change information or to input a name of an electronic device. Such a user input unit 207 may be installed in various forms such as a button form, a switch form, or a form that can input user data through another input device using a USB interface.

Figure 3A:
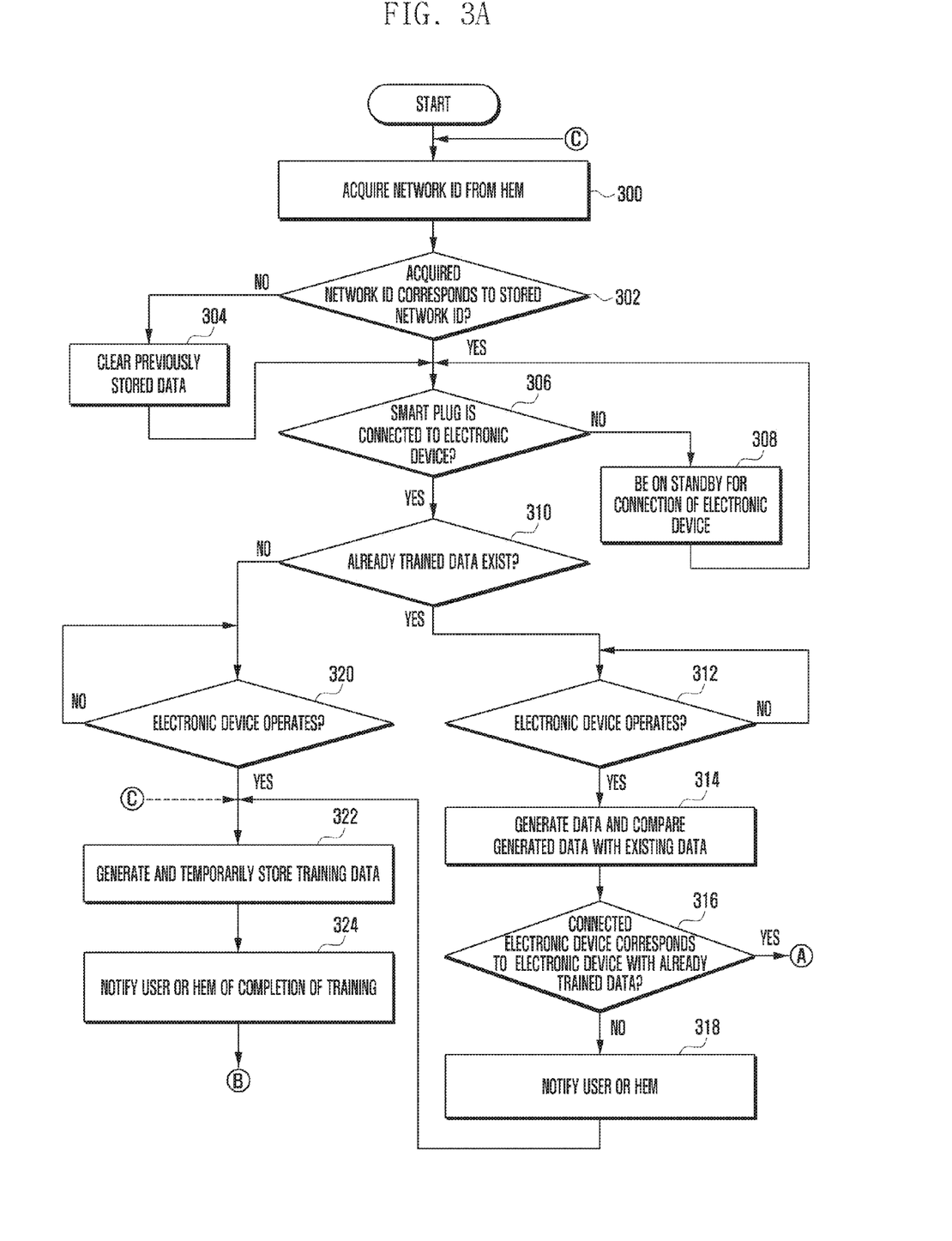
FIGS. 3A and 3B are flowcharts illustrating the control of change detection of an interlocked electronic device and setting thereof upon initial operation of a smart plug according to an exemplary embodiment of the present invention.
Figure 3B:
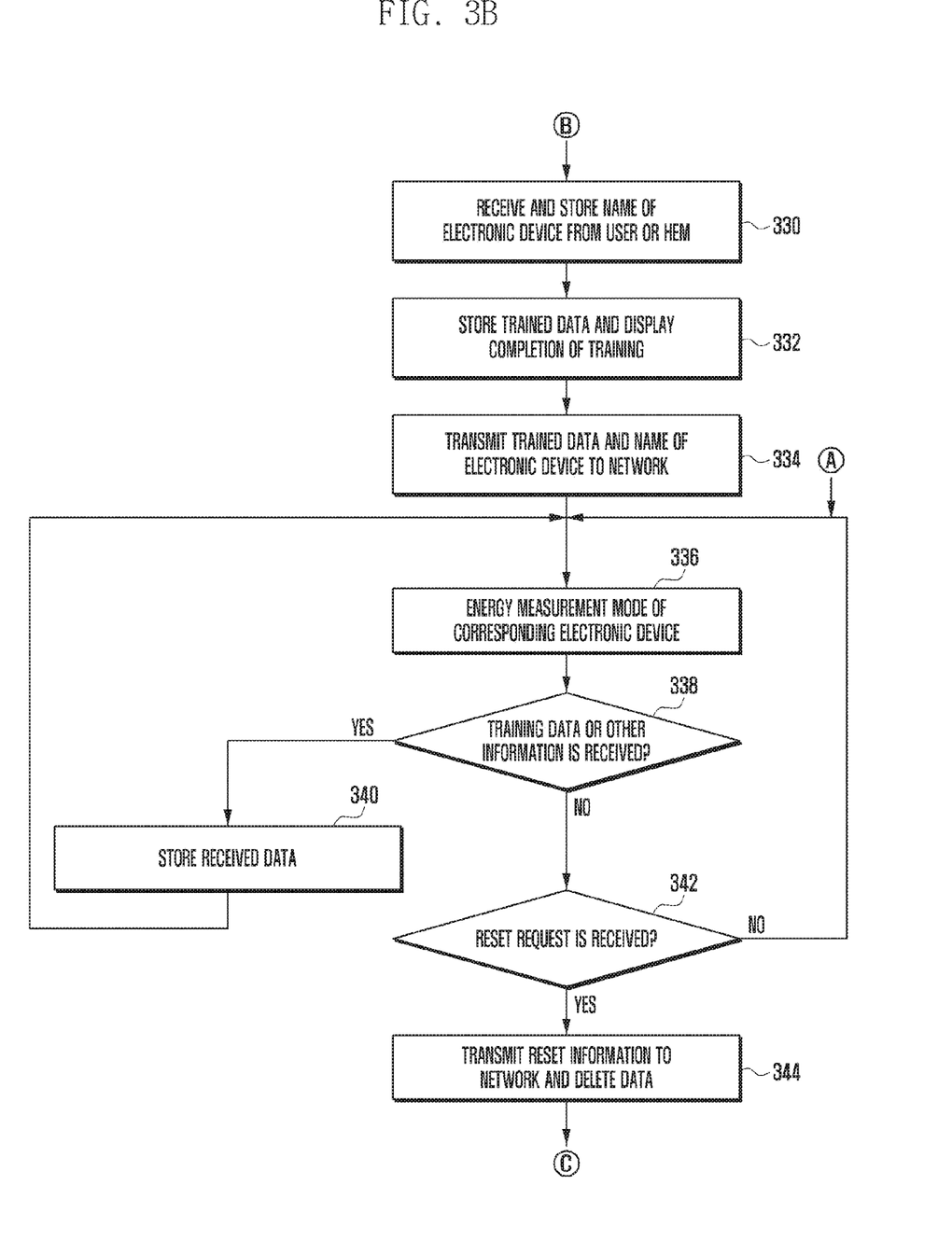

FIGS. 3A and 3B are flowcharts illustrating the control of change detection of an interlocked electronic device and setting thereof upon initial operation of a smart plug according to an exemplary embodiment of the present invention.

When the smart plug 200 is connected to a power source, the controller 211 controls the communication unit 205 to acquire network ID from a Home Energy Manager (HEM) at step 300. In this case, a network between the HEM and the smart plug(s) may be formed with a Personal Area Network (PAN), and respective HEM and smart plugs may have different identifiers. In the following description, the HEM and the smart plugs communicate with the PAN, and it is assumed that the network may be distinguished using PAN Identification (ID).

The controller 211 determines whether network ID acquired from the communication unit 205 corresponds to network ID stored at the memory 204 at step 302. Determination of step 302 is determination on whether a change occurs in a network to which the smart plug belongs. For example, when a location of the smart plug is changed from a home A to a home B, network ID may be changed. As another example, at a same home, even when a HEM is changed or even when a network provider that may be connected to a HEM is changed, network ID may be changed. When network ID is changed, all data stored at the memory 204 may become meaningless data. For an example, this may be because electronic devices such as a washing machine used at a home A and a washing machine, a refrigerator, and a dryer used at a home B may be different.

If network ID acquired from the communication unit 205 does not correspond to network ID stored at the memory 204, a home in which the smart plug is connected may be the same home, but the home A may be changed to the home B; thus, the controller 211 clears data previously stored at the memory 204 at step 304 and the process continues at step 306.

If network ID acquired from the communication unit 205 corresponds to network ID stored at the memory 204, a change may not occur at a home in which the smart plug is connected. The controller 211 determines whether the smart plug is connected to the electronic device at step 306. Whether the smart plug is connected to the electronic device may be detected through a pressing switch of a presser foot form, may be detected using a current path provided in the electronic device, and may be detected in various forms such as a method of using a sensor to determine whether the smart plug is connected to an electronic device. Further, at step 306, the controller 211 may receive a signal on whether the smart plug is directly connected to the electronic device from the plug connection portion 202 and may determine whether the electronic device is connected to the plug connection portion 202 through the power measurement unit 203.

If the smart plug is not connected to the electronic device, the controller 211 is on standby for a connection of the electronic device at step 308. While a connection of the electronic device is on standby, if a connection of the electronic device is detected, the process continues at step 310.

The controller 211 determines whether already trained data exist at the memory 204 at step 310. If already trained data exist at the memory 204, the process continues at step 312; and if already trained data does not exist at the memory 204, the process continues at step 320. When steps 306 and 310 are performed via step 304, already trained data may be not stored. In such a case, the process continues at step 320.

The controller 211 determines whether the electronic device operates at step 312. Here, a method of determining whether the electronic device operates may be performed using information for calculating active power, reactive power, and a power factor provided from the power measurement unit 203. For example, in a state in which power is not currently being used, for example, in a state in which active power is supplied lower than a predetermined threshold value using information for calculating active power, reactive power, and a power factor provided from the power measurement unit 203, when power is supplied, the controller 211 may determine the state to be a state in which the electronic device is not operating.

Electronic devices generally consume a minimum amount of power even in an idle state, and the minimum amount of power is referred to as standby state consumption power. For example, even in a state in which power is turned off, a television, audio device, set-top box, and microwave oven consume a minimum amount of power for time information acquisition and for time saving for initialization of a device. Therefore, even when the electronic device is not operating, the electronic device may be in a state that consumes a minimum amount of power. By previously setting a threshold value of a minimum amount of power that is consumed by an electronic device, it may be determined whether or not the electronic device is operating.

As another example, when power is consumed, it may be determined that the electronic device is in an operating state. As described above, by measuring a minimum amount of power used in a state in which power is turned off, information about a corresponding electronic device may be acquired. When producing a smart plug, it may be determined to select one of the two methods.

At step 312, operation of the electronic device may be operation of an actual specific state, for example, operation of water supply, washing, or rinse of a washing machine, operation of providing a moving picture and audio in a television, and operation of providing video and audio data to an electronic device such as a television through a predetermined network in a set-top box.

If the electronic device operates, the controller 211 may generate calculation data of active power, reactive power, and a power factor according to an operation state of the electronic device connected to the smart plug through information provided from the power measurement unit 203 at step 314. The controller 211 may compare generated data using information provided from the power measurement unit 203 with existing data stored at the memory 204. Thereafter, the controller 211 may determine whether a currently connected electronic device corresponds to an electronic device with already trained data at step 316.

Hereinafter, the foregoing description is described using Table 1. When an electronic device connected to the smart plug is a refrigerator, if calculated active power is 307 [W] based on information provided from the power measurement unit 203, the controller 211 may determine that the refrigerator is in a defrosting state, which is State 2. In order to make such a determination, representative values of the refrigerator in a specific state may be stored at a separate area of the memory 204 or may be included in a data table of Table 1.

Hereinafter, a method of setting representative values is exemplified. Representative values of each device may have a predetermined error range according to a value of active power. For example, in active power of 500 [W] or less, an error range may be set to ±10[W] or ±15[W]; and in active power of 500[W] to less than 1000[W], an error range may be set to ±30[W] or ±35[W]. As another method, in active power of 500[W] or less, an error range may be set to ±10%; and in active power of 500[W] to less than 1000[W], an error range may be set to ±5%.

By setting an error range in this way, when having a power value within an error range between information acquired from the power measurement unit 203 and a value of already trained data stored at a data table, the controller 211 may determine that the electronic device is the same electronic device.

Hereinafter, a case of determining the electronic device to be another electronic device is described. A case in which already trained data exist and in which already trained data is data of a refrigerator is exemplified. In such a case, when active power and reactive power acquired from the power measurement unit 203 are 488[W] and 348[W], respectively, the controller 211 may determine that the active power and the reactive power do not correspond to any one of active power and reactive power set to the refrigerator. Further, when active power and reactive power acquired from the power measurement unit 203 are 488[W] and 348[W], respectively, the value deviates from a predetermined error range of active power and reactive power of the refrigerator. Therefore, when the value deviates from an error range, the controller 211 may determine that the electronic device is not the same electronic device.

If the electronic device connected to the smart plug corresponds to a predetermined electronic device at step 316, the process continues at step 336, and if the electronic device connected to the smart plug does not correspond to a predetermined electronic device, the process continues at step 318.

If the electronic device connected to the smart plug does not correspond to a predetermined electronic device at step 316, the process continues at step 318. The controller 211 may notify the user or the HEM that a currently connected electronic device does not correspond to a predetermined electronic device at step 318. In this case, when information acquired from the smart plug connected to another electronic device exists in a data table, a matched electronic device may be provided as a recommended electronic device.

For example, as described above, at step 318 when the electronic device connected to the smart plug is a refrigerator and has a data table of Table 1 and when actually measured data has data similar to a washing machine, while providing a signal to the user or the HEM notifying that an actually connected electronic device is different from an electronic device connected to the smart plug, the controller 211 may transmit together name information of the washing machine to an electronic device estimated as connected to the smart plug. When name information of a connected electronic device together with information of active power, reactive power, and a power factor of an electronic device connected to a corresponding smart plug is provided from another smart plug and when the information is stored in a data table, such a case may be performed. When specific code information is provided instead of name information of the electronic device, corresponding code information may be notified to the HEM or the user. After step 318 is performed, step 322 may be performed.

If already trained data does not exist at the memory 204 at step 310, the controller 211 determines whether the electronic device operates at step 320. Here, a method of determining whether the electronic device operates may be performed using information for calculating active power, reactive power, and a power factor provided from the power measurement unit 203.

If the electronic device does not operate, the controller 211 may be on standby for operation of the electronic device. If the electronic device operates, the controller 211 may generate training data and temporarily store the generated training data at the memory 204 at step 322. A process of step 318 to step 322 may be equally performed. Further, as illustrated in Table 1, training may be performed in every specific cycle; and, as a result thereof, training data may be stored at the memory 204.

Thereafter, the controller 211 may notify the user or the HEM of completion of training with a predetermined specific method, for example, a wire communication method or a wireless communication method through the communication unit 205 at step 324. When training is complete, the controller 211 may control the display unit 206 instead of the communication unit 205 to notify the user of completion of training.

In this case, when the same cycle of data is received at least one time, it may be determined that specific training is complete. For example, when it is assumed that a refrigerator has four cycles, data of a first cycle is training and temporarily stored, and completion of training of a second cycle, a third cycle, to and a fourth cycle may be notified. When completion of training is determined, the first cycle to the fourth cycle may have different active power, reactive power, and power factors; thus, when information of a primary specific cycle, for example, the first cycle, is received and when the second cycle to the fourth cycle are complete, the first cycle is performed again. Therefore, when information of active power, reactive power, and a power factor corresponding to a secondary first cycle is detected, the controller 211 may recognize that an entire primary cycle is complete and that the same cycle is repeated. Therefore, when an entire cycle is complete and when the same specific cycle is repeated, training completion may be notified to the user or the HEM.

Thereafter, the controller 211 may receive and store a name of the electronic device from the user or the HEM at step 330. Operation of receiving and storing a name of an electronic device from a user or a HEM may be referred to as a tagging operation. In a process of performing such operation, a case of inputting information from a HEM is again described. When training of the electronic device connected to the smart plug is complete, the controller 211 may notify the HEM of completion of training with a predetermined communication method through the communication unit 205. In this case, as described above, when another smart plug performs training of a specific electronic device and includes a training result and named data acquired from the user or the HEM, corresponding data may be stored at the memory 204 of the smart plug. When data equal to or similar to trained data exist in another smart plug, the controller 211 may transfer corresponding named data as recommendation data to the HEM.

When a training completion message is received from a specific smart plug, the HEM may notify the user of reception of the training completion message and tag a name of an electronic device connected to the smart plug by an automatic program or through a direct input to the HEM by the user. In this case, when recommended name information is provided together from the smart plug, the HEM may display and notify the recommended name information to the user, and the user may select a corresponding electronic device or may tag a name of another electronic device. When tagging is complete, the HEM may provide name information to the corresponding smart plug.

After named data of the electronic device is stored at step 330, the process continues at step 332. The controller 211 may store trained data at the memory 204 and control the display unit 206 to display a training completion state at step 332. Before step 330, trained data may be stored at a temporary storage area of the memory 204. In this case, at step 330, when name information is received, at step 332, corresponding name information and trained data may be stored at Table 1. Further, in order to notify a smart plug in which training is complete, completion of training may be displayed in the display unit 206. Completion of training may be represented with turned-on blue LED or turned-off red LED or an icon or a message for displaying training completion may be displayed in an LCD panel. Further, training completion may be implemented through any one form of predetermined various forms.

Thereafter, the controller 211 may transmit a name of the electronic device and trained data to other smart plugs connected to a network of the HEM through the communication unit 205 at step 334. Other smart plugs may share information on an electronic device to which respective plugs are connected and trained information through such operation.

Thereafter, the controller 211 performs an energy measurement mode of a connected corresponding electronic device at step 336. Here, in an energy measurement mode, a consumption situation of energy may be continuously determined and consumed energy may be measured in a predetermined cycle unit.

Thereafter, the controller 211 may determine whether training data or other information is received from another smart plug through the communication unit 205 at step 338. If training data or other information is received from another smart plug through the communication unit 205, the controller 211 may store received data at a corresponding area at step 340. For example, when a name of another smart plug and trained data are received, by storing the name of another smart plug and the trained data at a corresponding area of the memory 204, Table 1 may be formed.

If training data or other information is not received, the controller 211 determines whether a reset request is received at step 342. If a reset request is received, the controller 211 transmits information notifying all smart plugs connected to a network of the HEM that the smart plug is reset and deletes all data stored at the memory 204 at step 344. When the smart plug is reset, the process returns to step 300.

Here, it is assumed that only a specific smart plug is reset. However, when an entire reset signal requiring reset of all smart plugs is received from the HEM through the communication unit 205, the reset signal is transmitted to other smart plugs of the network, and other smart plugs may be reset.

Further, a case in which a reset request is received through the user input unit 207 may be divided into two cases. For example, only a corresponding smart plug may be reset or all smart plugs of a network of the HEM may be reset using a pressing time of a reset button provided in the user input unit 207. Further, the user input unit 207 may have each button for all reset and reset of a corresponding smart plug.

Thereby, only one smart plug may be reset or after a reset signal is retransmitted to all smart plugs connected to the network of the HEM, all smart plugs may be reset. A user wanting to reset all smart plugs may reset all smart plugs by inputting at one time a reset signal. A case in which all smart plugs are reset may be a case in which a connection between smart plugs is largely changed because of a change of the HEM or movement.

Exemplary embodiments disclosed in this specification and drawings are suggested as a specific example to easily describe the present invention and to help understanding thereof and do not limit the scope of the present invention. Therefore, it should be understood that changes and variations obtained based on the spirit and scope of the present invention in addition to exemplary embodiments disclosed herein are included in the scope of the present invention.

INDUSTRIAL APPLICABILITY

The present invention can be used at various locations that measure and use power of each electronic device with a connection of an electronic device and a plug.

What is claimed is:

1. A method of detecting an electronic device connected to a smart plug, the method comprising:
   determining, by at least one processor of the smart plug, whether already trained data exists, when the electronic device is connected;
   determining, by the at least one processor of the smart plug, if already trained data exist, whether the connected electronic device corresponds to the already trained data;
   performing, by the at least one processor of the smart plug, training during which information of active power, reactive power, and a power factor of the connected electronic device is acquired, if the connected electronic device does not correspond to the already trained data; and
   storing, in a memory of the smart plug, trained data, when the training is complete.

2. The method of claim 1, further comprising transmitting, when storing the trained data, the stored trained data and an identifier of the smart plug to other smart plugs existing on a personal communication network.

3. The method of claim 1, further comprising:
   acquiring Identification (ID) of a home energy manager (HEM) from the HEM comprising the smart plug;
   determining whether ID of the HEM corresponds to ID of a previously stored HEM; and
   deleting, if ID of the HEM does not correspond to ID of a previously stored HEM, previously stored data.

4. The method of claim 3, further comprising being on standby for a connection of the electronic device, if ID of the HEM corresponds to ID of a previously stored HEM.

5. The method of claim 1, further comprising deleting the all stored trained data, when reset of the smart plug is requested.

6. The method of claim 5, further comprising notifying other smart plugs that can communicate with a HEM comprising the smart plug that the smart plug is reset, when reset of the smart plug is requested.

7. The method of claim 1, further comprising:
   generating, when reset of all other smart plugs connected to a HEM comprising the smart plug is requested, a reset instruction and transmitting the reset instruction to all other smart plugs that can communicate with the HEM; and
   deleting the all stored trained data.

8. The method of claim 1, further comprising notifying a HEM or a user of completion of training when the training is complete.

9. The method of claim 1, further comprising receiving and together storing, when storing the trained data, tagging information of the connected electronic device.

10. The method of claim 9, wherein the tagging information is information corresponding to a name of an electronic device received from the HEM or input by a user.

11. An apparatus for detecting an electronic device connected to a smart plug, the apparatus comprising:
- a plug connection portion that determines whether the electronic device is connected and that provides a path that supplies power, when the electronic device is connected;
- a socket connection portion connected to a socket that supplies electricity to supply power to the plug connection portion;
- a power measurement unit that measures power supplied from the socket connection portion to the plug connection portion;
- a memory that stores trained information of active power, reactive power, and a power factor;
- a communication unit that communicates with another smart plug or a Home Energy Manager (HEM); and
- at least one processor configured to:
    - determine whether already trained data exist at the memory, when detecting from the plug connection portion that the electronic device is connected,
    - determine whether the connected electronic device corresponds to the already trained data, if the already trained data exist, and
    - control to perform training during which information of active power, reactive power, and a power factor of the connected electronic device is acquired, and
    - store trained data at the memory, if the connected electronic device does not correspond to the training data.

12. The apparatus of claim 11, wherein the at least one processor is further configured to control to transmit the stored trained data when storing the trained data and an identifier of the smart plug to other smart plugs existing on a personal communication network through the communication unit.

13. The apparatus of claim 11, wherein the at least one processor is further configured to:
- control to acquire ID of a HEM from the HEM comprising the smart plug, to determine whether ID of the HEM corresponds to ID of a previously stored HEM, and
- delete previously stored data at the memory, if ID of the HEM does not correspond to ID of a previously stored HEM.

14. The apparatus of claim 13, wherein the at least one processor is further configured to be on standby for a connection of the electronic device, if ID of the HEM corresponds to a previously stored ID of the HEM.

15. The apparatus of claim 11, further comprising a user input unit that detects a reset request,
wherein the controller controls to delete all trained data stored at the memory, when reset of the smart plug is requested from the user input unit or the communication unit.

16. The apparatus of claim 15, wherein the at least one processor is further configured to control the communication unit to notify other smart plugs on a network of a HEM to which the smart plug belongs that the smart plug will be reset before reset of the smart plug.

17. The apparatus of claim 11, wherein the at least one processor is further configured to:
- generate a reset instruction, when reset of all other smart plugs connected to the HEM comprising the smart plug is requested,
- control the communication unit to transmit the reset instruction to all other smart plugs that can communicate with the HEM, and
- control to delete all trained data stored at the memory.

18. The apparatus of claim 11, wherein the at least one processor is further configured to control the communication unit to notify the HEM or a user of training completion, upon completing the training.

19. The apparatus of claim 11, wherein the at least one processor is further configured to control to receive and together store tagging information of the connected electronic device, when storing the trained data.

20. The apparatus of claim 19, wherein the tagging information is information corresponding to a name of an electronic device received from the HEM.

* * * * *